United States Patent
Mizutani (10) Patent No.: US 11,317,550 B2
(45) Date of Patent: Apr. 26, 2022

(54) COMPONENT MOUNTING MACHINE

(71) Applicant: FUJI CORPORATION, Chiryu (JP)

(72) Inventor: Yutaka Mizutani, Kaizu (JP)

(73) Assignee: FUJI CORPORATION, Chiryu (JP)

( * ) Notice: Subject to any disclaimer, the term of this patent is extended or adjusted under 35 U.S.C. 154(b) by 93 days.

(21) Appl. No.: 16/648,265

(22) PCT Filed: Sep. 28, 2017

(86) PCT No.: PCT/JP2017/035286
§ 371 (c)(1),
(2) Date: Mar. 18, 2020

(87) PCT Pub. No.: WO2019/064449
PCT Pub. Date: Apr. 4, 2019

(65) Prior Publication Data
US 2020/0245515 A1    Jul. 30, 2020

(51) Int. Cl.
*H05K 13/04* (2006.01)
*H05K 13/08* (2006.01)

(52) U.S. Cl.
CPC ....... *H05K 13/041* (2018.08); *H05K 13/0406* (2018.08); *H05K 13/0419* (2018.08); *H05K 13/0882* (2018.08)

(58) Field of Classification Search
CPC ............. H05K 13/0406; H05K 13/041; H05K 13/0419; H05K 13/0882
See application file for complete search history.

(56) References Cited

U.S. PATENT DOCUMENTS 10,531,601 B2 * 1/2020 Ito .................. H05K 13/041
10,555,450 B2 * 2/2020 Iisaka ............. H05K 13/0409
(Continued)

FOREIGN PATENT DOCUMENTS

EP    3 217 777 A1 *  9/2017
EP    3 217 777 A1     9/2017
(Continued)

OTHER PUBLICATIONS

International Search Report dated Dec. 12, 2017 in PCT/JP2017/035286 filed Sep. 28, 2017, citing documents AA and AO-AR therein, 2 pages.
(Continued)

*Primary Examiner* — Carl J Arbes
(74) *Attorney, Agent, or Firm* — Oblon, McClelland, Maier & Neustadt, L.L.P.

(57) ABSTRACT

A component mounting machine including a head provided with multiple nozzles to pick up the components; a raising and lowering device to individually raise and lower the multiple nozzles; a moving device to move the head relative to the board in a plane perpendicular to a raising and lowering direction of the nozzles; and a control device to perform, as a pickup operation for causing the nozzle to pick up a component, a first pickup operation of controlling the moving device and the raising and lowering device so as to lower a single one of the nozzles above the component supply section to pick up one of the components using that nozzle, and a second pickup operation of controlling the moving device and the raising and lowering device so as to simultaneously lower multiple of the nozzles above the component supply section to pick up multiple of the components simultaneously using the multiple nozzles.

8 Claims, 8 Drawing Sheets

(56) References Cited

U.S. PATENT DOCUMENTS

2017/0064883 A1* 3/2017 Kawai ................. H05K 13/041
2017/0311493 A1* 10/2017 Ito ...................... H05K 13/0408
2017/0325369 A1* 11/2017 Iisaka ................... H05K 13/08

FOREIGN PATENT DOCUMENTS

| JP | 2004-356376 A | | 12/2004 |
| JP | 2004356376 A | * | 12/2004 |
| JP | 2007-189041 A | | 7/2007 |
| JP | 2007189041 A | * | 7/2007 |
| JP | 2008108776 A | * | 5/2008 |
| WO | 2013140600 A1 | * | 9/2013 |
| WO | 2016063328 A1 | * | 4/2016 |
| WO | WO 2016/063328 A1 | | 4/2016 |
| WO | 2016072014 A1 | * | 5/2016 |
| WO | WO 2016/072014 A1 | | 5/2016 |

OTHER PUBLICATIONS

Extended European Search Report dated Aug. 20, 2020 in corresponding European Patent Application No. 17926918.8 citing documents AA, AO therein, 9 pages.

\* cited by examiner

COMPONENT MOUNTING MACHINE

TECHNICAL FIELD

This specification discloses a component mounting machine.

BACKGROUND ART

Conventionally, there are known component mounting machines provided with a mounting head including multiple suction nozzles that are used to simultaneously pick up multiple components. For example, patent literature 1 discloses a component mounting machine in which, for multiple suction nozzles attached to a mounting head, a component holding range is set around each component holding center as a center, and when the components are simultaneously picked up from multiple component pickup positions by the multiple suction nozzles, the respective component pickup positions are aligned so as to fall within the respective component holding ranges. With this component mounting machine, for multiple suction nozzles, the positional deviation amount between the center of gravity of each of the overlapping ranges of the theoretical component holdable ranges and each of the component holding centers is calculated, and the calculated positional deviation amount is used as a correction amount of the moving position of the head section. Further, the component mounting machine detects the positional deviation amount of the holding position of components picked up in the past with respect to the component holding center, multiplies the detected positional deviation amount by a factor ranging from 0.1 to 1 to correct the detected positional deviation amount, and sets the next component holding target center based on the corrected value.

CITATION LIST

Patent Literature
Patent literature 1: JP-A-2004-356376

BRIEF SUMMARY

Technical Problem

However, with the component mounting machine described above, since the simultaneous pickup of multiple components is performed even while the correction value of the positional deviation is not stabilized, sufficient accuracy cannot be obtained, and pickup errors may occur.

It is an object of the present disclosure to perform a simultaneous pickup operation for simultaneously picking up multiple components using multiple nozzles with high accuracy.

Solution to Problem

The present disclosure employs the following means to achieve the above object.

Disclosed herein is a component mounting machine including: a component supply section, the component mounting machine being configured to pick up components supplied from multiple component feeders arranged on the component supply section and mount the components on a board; a head provided with multiple nozzles configured to pick up the components; a raising and lowering device configured to individually raise and lower the multiple nozzles; a moving device configured to move the head relative to the board in a plane perpendicular to a raising and lowering direction of the nozzles; and a control device configured to perform, as a pickup operation for causing the nozzle to pick up a component, a first pickup operation of controlling the moving device and the raising and lowering device so as to lower a single one of the nozzles above the component supply section to pick up one of the components using that nozzle, and a second pickup operation of controlling the moving device and the raising and lowering device so as to simultaneously lower multiple of the nozzles above the component supply section to pick up multiple of the components simultaneously using the multiple nozzles, wherein, in a case in which pickup operation and mounting operation is to be performed repeatedly for a same type of the component, initially the first pickup operation is performed for each of the multiple nozzles, and during the first pickup operation the control device is configured to learn a correction value for correcting a deviation of a pickup position of each of the components picked up by the multiple nozzles, and subsequent to a specified condition being satisfied, perform the second pickup operation using the learned correction value.

A component mounting machine of the disclosure includes a control device configured to perform a first pickup operation and a second pickup operation as a pickup operation for picking up a component using nozzle. In the first pickup operation, one nozzle is lowered above the component supply section to pick up a component using the one nozzle. In the second pickup operation, multiple nozzles are simultaneously lowered above the component supply section, and multiple components are simultaneously picked up using the multiple nozzles. The control device is configured to, in a case in which pickup operation and mounting operation is to be performed repeatedly for a same type of the component, initially perform the first pickup operation for each of the multiple nozzles, and during the first pickup operation, learn a correction value for correcting a deviation of a pickup position of each of the components picked up by the multiple nozzles, and subsequent to a specified condition being satisfied, perform the second pickup operation using the learned correction value. In this manner, with a component mounting machine of the present disclosure, when pickup operation and mounting operation are performed repeatedly for the same type of component, the first pickup operation is performed for each of the multiple nozzles to learn the correction value for correcting the deviation of the pickup position, and then the second pickup operation is performed. As a result, a component mounting machine of the present disclosure can perform simultaneous pickup operation of simultaneously picking up multiple components using multiple nozzles with high accuracy. Here, "perpendicular" does not have to be strictly perpendicular, but may be substantially perpendicular (hereinafter the same).

DESCRIPTION OF EMBODIMENTS

Embodiments of the present disclosure are described below with reference to the figures.

Figure 1:
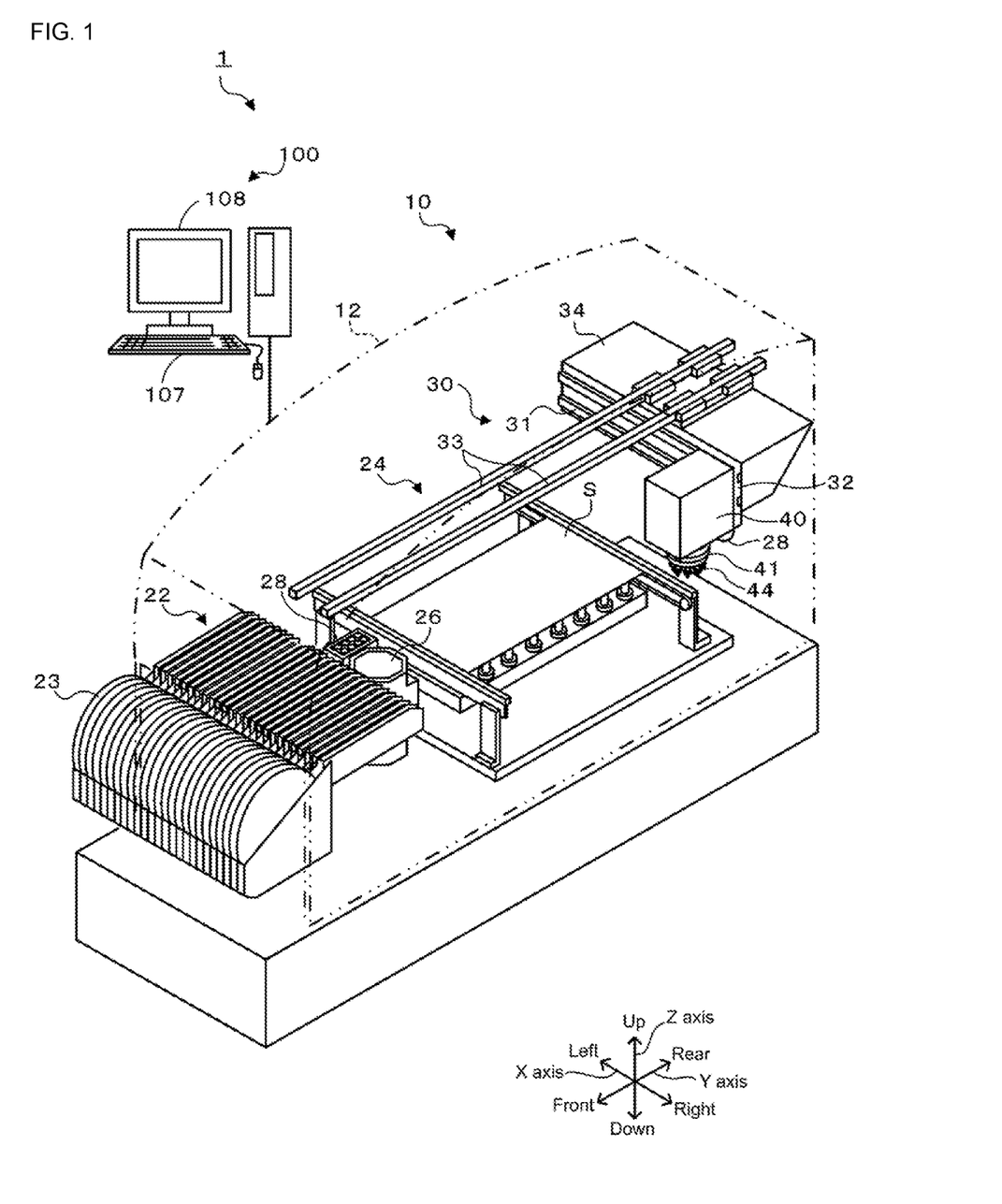
FIG. 1 is a configuration diagram showing an outline of the configuration of component mounting system 1.
Figure 2:
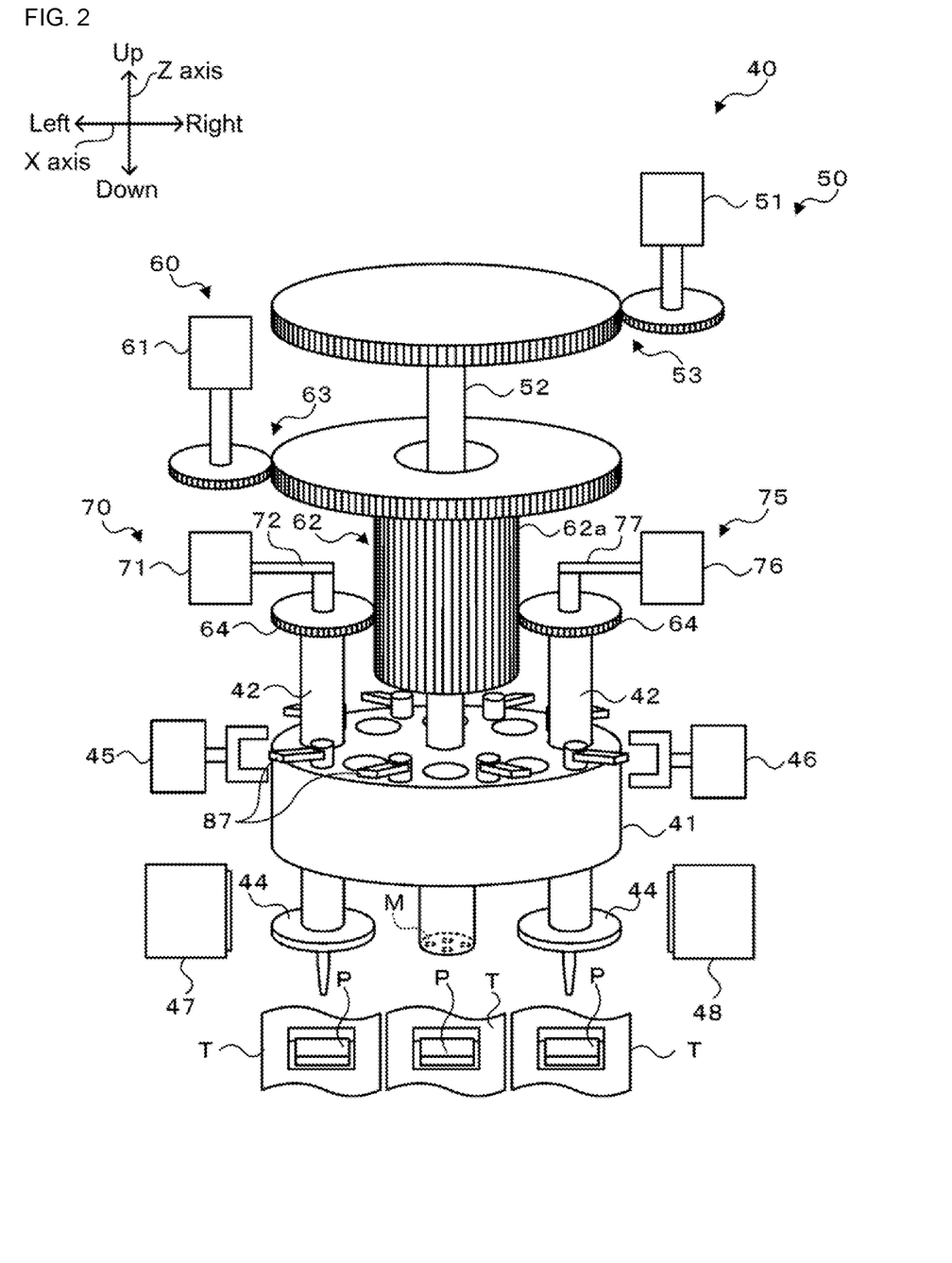
FIG. 2 is a configuration diagram showing an outline of the configuration of mounting head 40.
Figure 3:
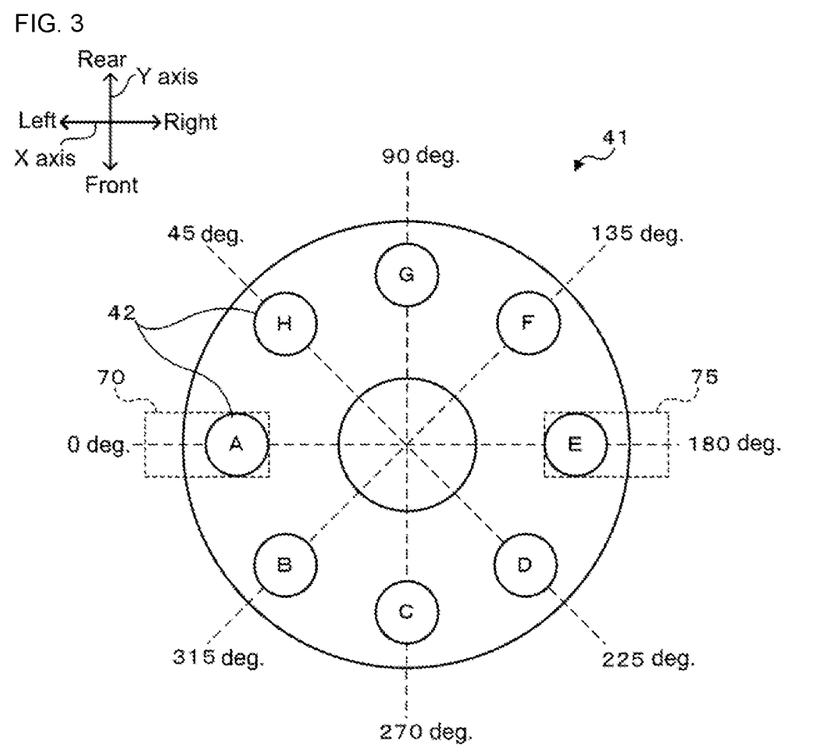
FIG. 3 illustrates the arrangement of nozzle holders 42, and the arrangement of first Z-axis driving device 70 and second Z-axis driving device 75.
Figure 4:
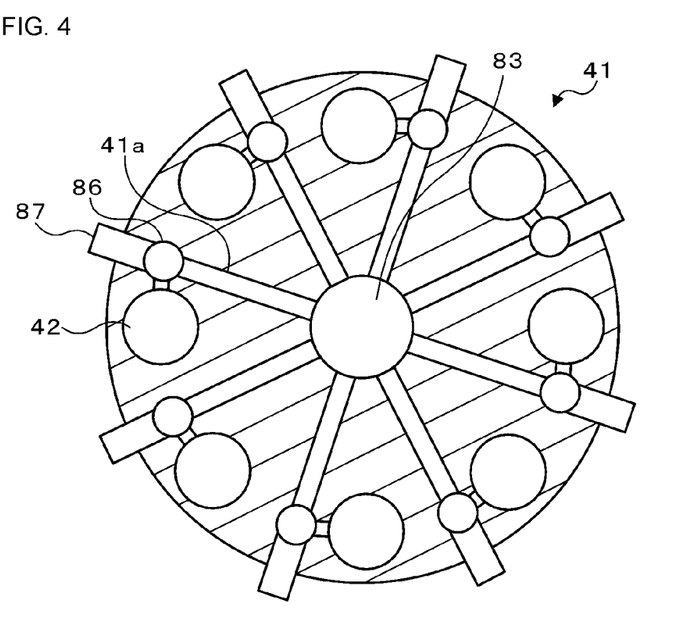
FIG. 4 illustrates air pipe paths.
Figure 5:
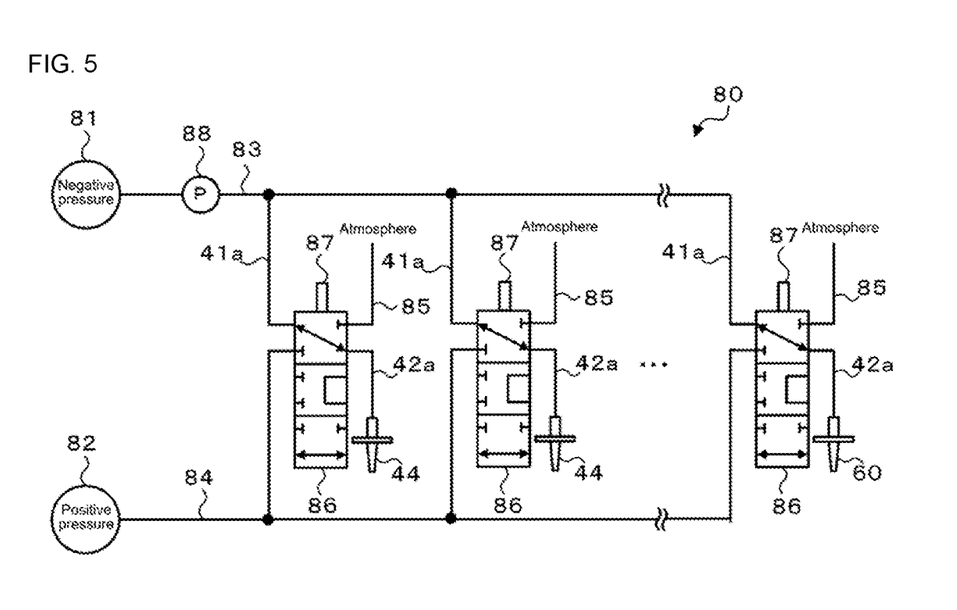
FIG. 5 is a configuration diagram showing an outline of the configuration of pressure supply device 80.
Figure 6:
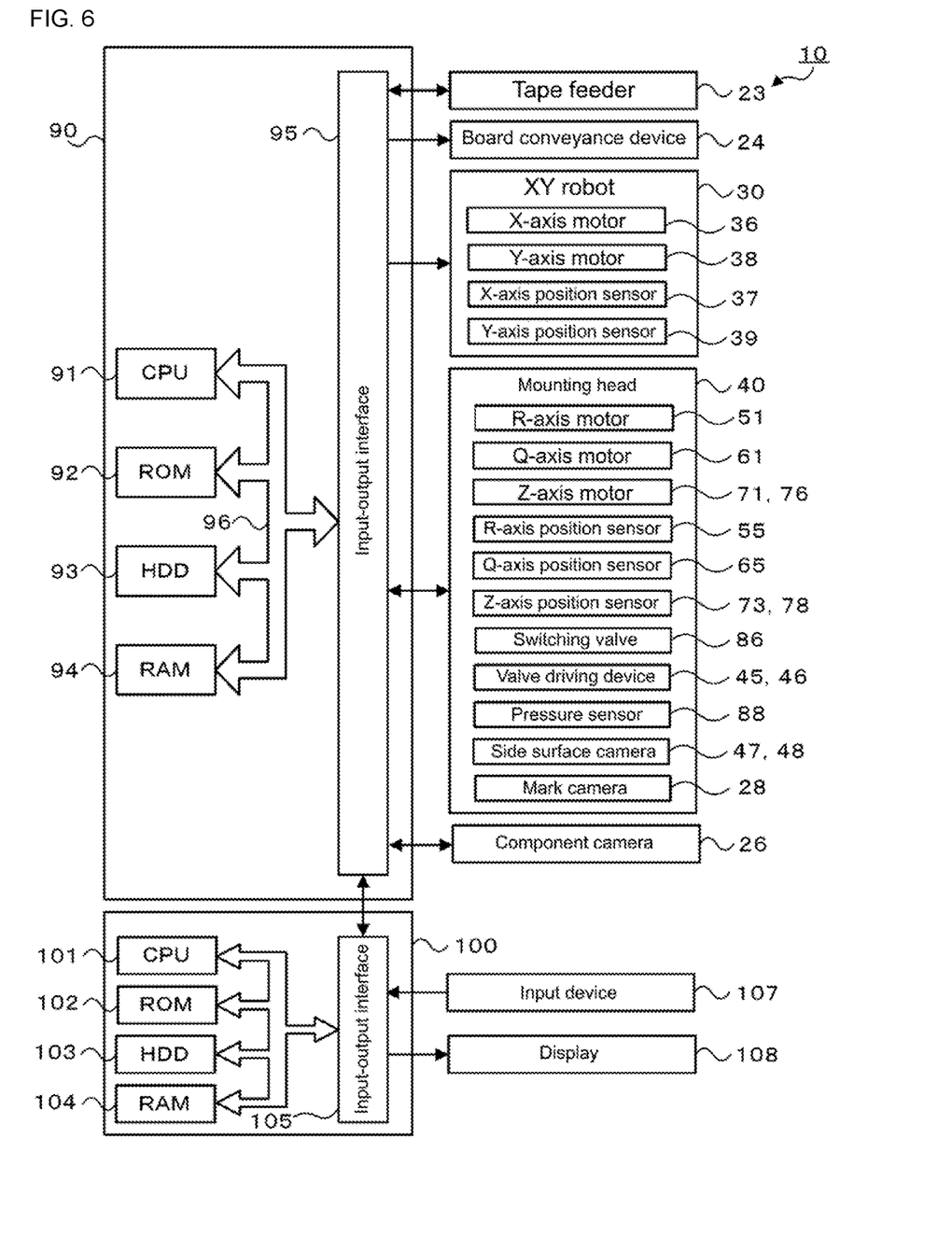
FIG. 6 illustrates electrical connections of control device 90 and management device 100.

FIG. 1 shows the overall configuration of component mounting system 10. FIG. 2 is a configuration diagram showing an outline of the configuration of mounting head 40. FIG. 3 illustrates the arrangement of nozzle holders 42, and the arrangement of first Z-axis driving device 70 and second Z-axis driving device 75. FIG. 4 illustrates air pipe paths. FIG. 5 is a configuration diagram showing an outline of the configuration of pressure supply device 80. FIG. 6 illustrates electrical connections of control device 90 and management device 100. Note that the left-right direction in FIG. 1 is the X-axis direction, the front-(near)-rear(far) direction is the Y-axis direction that is substantially perpendicular to the X-axis direction, and the vertical direction is the Z-axis direction substantially perpendicular to the X-axis direction and the Y-axis direction (horizontal plane).

As shown in FIG. 1, component mounting system 1 is provided with component mounting machine 10 and management device 100 that manages component mounter 10. In the embodiment, component mounting system 1 includes multiple component mounting machines 10.

As shown in FIG. 1, component mounting machine 10 includes housing 12, component supply section 22, board conveyance device 24, XY robot 30, mounting head 40, and control device 90 (see FIG. 6). Also, component mounting machine 10 includes component camera 26, mark camera 28, nozzle station 29, and the like. Component camera 26 is provided between component supply section 22 and board conveyance device 24, and is for capturing an image from below of the orientation of component P held by suction nozzle 44 of mounting head 40. Mark camera is provided on mounting head 40, and is for capturing an image from above and reading positioning reference marks provided on board S. Nozzle station 29 is provided between component supply section 22 and board conveyance device 24 and is for stocking suction nozzles 44 to be attached to nozzle holders 42 of mounting head 40.

As shown in FIG. 1, component supply section 22 is provided at the front of component mounting machine 10, and multiple tape feeders 23 are arranged along the X-axis direction (left-right direction). Note that, tape feeder 23 is provided with a reel that accommodates tape T in which components P are arranged, and supplies the components P to a component supply position by pulling out the tape T from the reel and feeding it to the rear (Y-axis direction). Tape T has multiple recesses formed longitudinally at predetermined intervals. Each of the multiple recesses accommodates a component P of the same type. Component P accommodated in a recess is protected by a film covering the top surface of tape T, with the film being peeled off and in front of the component supply position to expose the component, after which the component is picked up by suction nozzle 44 at the component supply position.

Board conveyance device 24 includes a pair of conveyor belts provided extending in the X-axis direction (left-right direction) and separated in the front-rear direction of FIG. 1. Board S is conveyed from left to right in the drawing by the conveyor belts of board conveyance device 24.

XY robot 30 is for moving mounting head 40 in the XY-axis directions (front-rear and left-right directions), and includes X-axis slider 32 and Y-axis slider 34, as shown in FIG. 1. X-axis slider 32 is supported by a pair of upper and lower X-axis guide rails 31 provided on the front surface of Y-axis slider 34 so as to extend in the X-axis direction (left-right direction), and is movable in the X-axis direction by driving of X-axis motor 36 (refer to FIG. 6). Y-axis slider 34 is supported by a pair of left and right Y-axis guide rails 33 provided on an upper section of housing 12 so as to extend in the Y-axis direction (front-rear direction), and is movable in the Y-axis direction by driving of Y-axis motor 38 (refer to FIG. 6). Note that, the position of the X-axis slider 32 in the X-axis direction is detected by X-axis position sensor 37 (refer to FIG. 6), and the position of Y-axis slider 34 in the Y-axis direction is detected by Y-axis position sensor 39 (refer to FIG. 6). Mounting head 40 is attached to X-axis slider 32. Therefore, mounting head 40 can be moved to any position on the XY plane (horizontal plane) by performing drive control of XY robot 30 (X-axis motor 36 and Y-axis motor 38).

As shown in FIG. 2, mounting head 40 includes head main body 41, multiple (eight in the present embodiment) nozzle holders 42, multiple (eight in the present embodiment) suction nozzles 44, R-axis driving device 50, Q-axis driving device 60, first Z-axis driving device 70, second Z-axis driving device 75, side surface cameras 47 and 48. Mounting head 40 is configured to be detachable from X-axis slider 32 for convenient exchange.

Head main body 41 is a rotation body rotatable by R-axis driving device 50. Nozzle holders 42 are arranged circumferentially with respect to head main body 41 at predetermined angular intervals (45 degrees in the present embodiment) and are supported by head main body 41 so as to be raised and lowered independently. Suction nozzle 44 is attached to the distal end section of nozzle holder 42. Suction nozzle 44 is attachable to and detachable from nozzle holder 42, and suction nozzles are exchanged as appropriate depending on the type of component P to be picked up.

R-axis driving device 50 rotates (revolves) the multiple nozzle holders 42 (multiple suction nozzles 44) in a circumferential direction around the center axis of head main body 41. As shown in FIG. 2, R-axis driving device 50 includes R-axis motor 51, R axis 52 extending axially from the center axis of head main body 41, and transmission gear 53 for transmitting the rotation of R-axis motor 51 to R-axis 52. R-axis driving device 50 rotates head main body 41 by rotationally driving R axis 52 via transmission gear 53 by R-axis motor 51. Each nozzle holder 42 rotates (revolves) circumferentially together with a suction nozzle 44 by the rotation of head main body 41. R-axis driving device 50 further includes R-axis position sensor 55 (refer to FIG. 6) for detecting the rotational position of R axis 52, that is, the revolution position of nozzle holders 42 (suction nozzles 44).

Q-axis driving device 60 rotates (spins) each nozzle holder 42 (each suction nozzle 44) about its center shaft. As shown in FIG. 2, Q-axis driving device 60 includes Q-axis motor 61, cylindrical gear 62, transmission gear 63, and Q-axis gear 64.

Cylindrical gear 62 has R axis 52 coaxially inserted therethrough to be relatively rotatably, and has external teeth 62a formed on its outer peripheral surface. Transmission gear 63 is for transmitting the rotation of Q-axis motor 61 to cylindrical gear 62. Q-axis gear 64 is provided above nozzle holders 42 and slidably engages with external teeth 62a of cylindrical gear 62 in the Z-axis direction (vertical direction). Q-axis driving device 60 can rotate each Q-axis gear 64 engaging with external teeth 62a of cylindrical gear 62 collectively in the same direction by rotationally driving cylindrical gear 62 via transmission gear 63 by Q-axis motor 61. Each nozzle holder 42 rotates about its center axis integrally with suction nozzle 44 by the rotation of Q-axis gear 64. Q-axis driving device 60 further includes Q-axis position sensor 65 (refer to FIG. 6) for detecting the rotational position of Q-axis gear 64, that is, the rotational position of nozzle holders 42 (suction nozzles 44).

First and second Z-axis driving devices 70 and 75 are configured to be able to raise and lower nozzle holders 42 individually at two locations on the revolution (rotation) path of the nozzle holders 42. In the present embodiment, as shown in FIG. 3, first Z-axis driving device 70 is capable of raising and lowering nozzle holder 42 at a position of 0 degrees (hereinafter, also referred to as Z1) among the nozzle holders 42 supported on head main body 41. Further, second Z-axis driving device 70 is capable of raising and lowering nozzle holder 42 at a position of 180 degrees (hereinafter, also referred to as Z2) among the nozzle holders 42 supported on head main body 41. Note that, the 0 degree position is a position on an upstream side in the board conveyance direction among two points on a line parallel to the X-axis direction (board conveyance direction) passing through the center axis of head main body 41 (A in FIG. 3), and the 180 degree position is on a downstream side on the board conveyance direction of the above two points.

As shown in FIG. 2, first and second Z-axis driving devices 70 and 75 are respectively provided with Z-axis sliders 72 and 77 and the corresponding Z-axis motors 71 and 76 for raising and lowering Z-axis sliders 72 and 77. First and second Z-axis driving devices 70 and 75, by driving Z-axis motors 71 and 76 to raise and lower the corresponding Z-axis sliders 72 and 77, contact the nozzle holder 42 below Z-axis sliders 72 and 77 such that the nozzle holder 42 is raised or lowered integrally with suction nozzle 44. Note that, first and second Z-axis driving devices 70 and 75 may use a linear motor as Z-axis motors 71 and 76 to raise and lower Z-axis sliders 72 and 77, or may use a rotating motor and screw feeding mechanism to raise and lower Z-axis sliders 72 and 77. Further, first and second Z-axis driving devices 70 and 75, instead of Z-axis motors 71 and 76, may use an actuator such as an air cylinder to raise and lower Z-axis sliders 72 and 77. In this manner, mounting head of the present embodiment is provided with two Z-axis driving devices, 70 and 75, capable of individually raising and lowering nozzle holders 42 (suction nozzles 44) such that pickup operation of component P by suction nozzle 44 can be performed individually using Z-axis driving devices 70 and 75. Thus, mounting head 40 is able to lower two suction nozzles 44 simultaneously to pick up two components P simultaneously by supplying two components P from tape feeders 23 lined up in the X-axis direction (left-right direction) with the same interval as two suction nozzles 44 that can be raised and lowered by the two Z-axis driving devices 70 and 75. Further, first and second Z-axis driving devices 70 and 75 are also provided with Z-axis position sensors 73 and 78 (refer to FIG. 6) for detecting the raising and lowering position of the corresponding Z-axis slider 72 and 77, that is, the raising and lowering position of the corresponding nozzle holder 42 (suction nozzle 44).

Suction nozzle 44 is capable of picking up component P and mounting component P on board S by being supplied with pressure (negative pressure, positive pressure) supplied by pressure supply device 80. As shown in FIG. 5, pressure supply device 80 includes negative pressure source (negative pressure pump) 81, positive pressure source (factory air) 82, and switching valve 86 capable of switching the pressure supplied to the pickup openings of suction nozzles 44 to any of negative pressure, positive pressure, and atmospheric pressure. Switching valve 86 is a four-opening three-position valve connected in which are negative pressure flow path 83 connected to negative pressure source 81, positive pressure flow path 84 connected to positive pressure source 82, atmospheric pressure flow path 85 connected to the atmosphere, and holder flow path 42a formed inside nozzle holder 42 connected to the suction opening of suction nozzle 44. Switching valve 86 can supply negative pressure to the suction opening of suction nozzle 44 by switching the valve position to a position (negative pressure supply position) where holder flow path 42a is connected to negative pressure flow path 83 and is shut off from the other flow paths. Also, switching valve 86 can supply atmospheric pressure to the suction opening of suction nozzle 44 by switching the valve position to a position (atmospheric pressure supply position) where holder flow path 42a is connected to atmospheric pressure flow path 85 and is shut off from the other flow paths. Further, switching valve 86 can supply positive pressure to the suction opening of suction nozzle 44 by switching the valve position to a position (positive pressure supply position) where holder flow path 42a is connected to positive pressure flow path 84 and is shut off from the other flow paths. As shown in FIG. 4, switching valve 86 is provided corresponding to each nozzle holder 42 (holder flow path 42a), is connected to the negative pressure flow path 83 via radial flow path 41a extending radially from the axial center of head main body 41, and is connected to positive pressure flow path 84 via a radial flow path (not shown) extending in the same manner. Pressure sensor 88 for detecting the pressure (negative pressure) inside negative pressure flow path 83 is provided in negative pressure flow path 83.

Further, switching valve 86 does not have an automatic return function, and the valve position is switched to the negative pressure supply position, the atmospheric pressure supply position, and the positive pressure supply position by the operation of valve operating lever 87. Valve operating lever 87 is operated by either of first and second valve driving devices 45 and 46, as shown in FIG. 2. First valve driving device 45 can drive valve operating lever 87 of switching valve 86 corresponding to the nozzle holder 42 in the position (Z1) at which movement up and down by first Z-axis driving device 70 is possible. Second valve driving device 46 can drive valve operating lever 87 of switching valve 86 corresponding to the nozzle holder 42 in the position (Z2) at which movement up and down by second Z-axis driving device 75 is possible. Note that, first and second valve driving device 45 and 46 can be configured by using, for example, a motor and a converting mechanism (such as a cam mechanism or a linkage mechanism) for converting the rotational movement of the motor into stroke movement.

Side surface cameras 47 and 48 image the vicinity of the distal end portion of suction nozzle 44 from the side in order to determine whether a component is being held by the suction nozzle 44 and the pickup orientation of the component after the pickup operation has been performed by the suction nozzle 44. In the present embodiment, after a suction nozzle 44 has been lowered by first Z-axis driving device 70 and pickup operation has been performed, side surface camera 47 can take an image of the suction nozzle 44 revolved previously by R-axis driving device 50. Further, after a suction nozzle 44 has been lowered by second Z-axis driving device 70 and pickup operation has been performed, side surface camera 48 can take an image of the suction nozzle 44 revolved previously by R-axis driving device 50.

As shown in FIG. 6, control device 90 is configured from CPU 91 that is based around a microprocessor, and is also provided with items such as ROM 92, HDD 93, RAM 94, and input-output interface 95. These items are connected by bus 96. Various detection signals from X-axis position sensor 37, Y-axis position sensor 39, R-axis position sensor 55, Q-axis position sensor 65, Z-axis position sensors 73 and 78, pressure sensor 88, and the like are inputted to control device 90. Also, image signals from component camera 26, mark camera 28, and side surface cameras 47 and 48 are also inputted to control device 90 via input-output interface 95. On the other hand, control device 90 outputs various control signals to tape feeder 23, board conveyance device 24, X-axis motor 36, Y-axis motor 38, R-axis motor 51, Q-axis motor 61, Z-axis motor 71 and 76, first and second valve driving devices 45 and 46, component camera 26, mark camera 28, side surface cameras 47 and 48, and the like.

Management device 100, for example, is a general purpose computer configured from, as shown in FIG. 4, items such as CPU 101, ROM 102, HDD 103, RAM 104, and input-output interface 105. Management computer 100 receives input signals from input device 107 such as a mouse or keyboard via input-output interface 105. Management device 100 outputs image signals to display 108 via input-output interface 105. HDD 103 stores job information including a production program of the board S and other production information. Here, a production program refers to a program that determines which components P are mounted on which board S in which order in component mounting machine 10, and how many pieces of the board S so mounted are produced. Further, the production information includes component information (type and component supply position of component P) relating to components P to be mounted on board S, nozzle information relating to suction nozzle 44 to be used, target mounting position (XY coordinate) of component P, and the like. Management device 100 is communicably connected to control device 90 of component mounting machine 10, and communication is performed of various kinds of data and control signals.

Component mounting machine 10 according to the embodiment configured as described above performs pickup operation, imaging operation, and mounting operation as one cycle when the job information is received by management device 100. Pickup operation is an operation in which mounting head 40 is moved above the component supply position, a corresponding nozzle holder 42 is lowered while each nozzle holder 42 (suction nozzle 44) is revolved such that component P contacts the suction opening of the suction nozzle 44 in the component supply position, and negative pressure is supplied to the suction opening of the corresponding suction nozzle 44. Imaging operation is an operation of using component camera 26 to capture an image of the component P held by the suction nozzle 44 in the pickup operation, and detecting a pickup deviation by processing the obtained captured image to correct the target mounting position of the component P. Note that, in the present embodiment, imaging operation is performed by capturing an image of head mark M provided on mounting head 40 together with the component P held by suction nozzle 44 using component camera 26, thereby recognizing the pickup position of component P with respect to head mark M. Mounting operation is an operation in which the mounting head 40 is moved above a target mounting position on board S, the corresponding nozzle holder 42 is lowered while the nozzle holders 42 (the suction nozzle 44) are revolved such that the component P held by the suction nozzle 44 contacts the target mounting position, and positive pressure is supplied to the suction opening of the corresponding suction nozzle 44.

Figure 7:
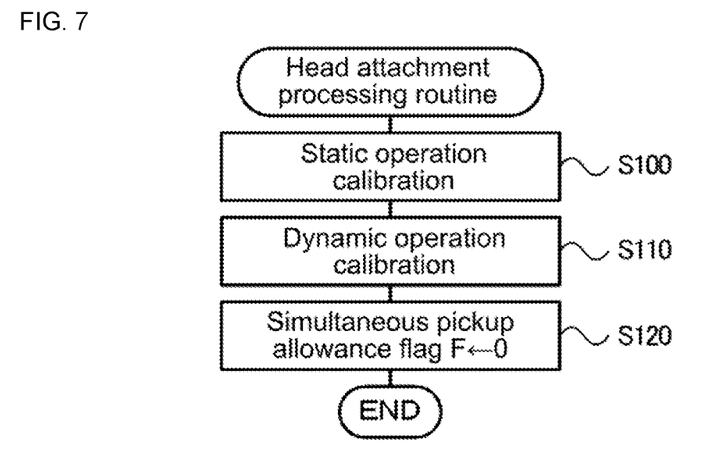
FIG. 7 is a flowchart showing an example of a head attachment processing routine.

Next, operation of component mounting machine 10 when mounting head 40 is exchanged will be described. FIG. 7 is a flowchart showing an example of a processing routine performed by CPU 91 of control device 90 when the head is attached. This routine is performed when mounting head 40 is newly attached to X-axis slider 32. When the head attachment processing routine is performed, CPU 91 of control device 90 performs static operation calibration (S100). Here, static operation calibration is processing for measuring the positions of component camera 26, mark camera 28, and head mark M, the position of each nozzle holder 42 with respect to head mark M during raising, the tilt position of each nozzle holder 42 during lowering, the presence of bending in suction nozzle 44, and the position of suction nozzle 44, and adjusting each of these positions. Note that, measurement of the position of component camera 26 may be performed using mark camera 28, and measurement of other positions may be performed using component camera 26.

Continuing, CPU 91 performs dynamic operation calibration. Dynamic operation calibration is processing for measuring operation of each nozzle holder 42 assuming single pickup operation to be described later and operation of each nozzle holder 42 assuming simultaneous pickup operation to be described later, and adjusting these operations. Measurement of operation assuming single pickup operation is performed by using XY robot 30 to move mounting head 40 above component camera 26, using R-axis driving device 50 to revolve each nozzle holder 42, using one of first and second Z-axis driving devices 70 and 75 to lower a corresponding nozzle holder 42, and imaging a stopping position of that nozzle holder 42 using component camera 26. Measurement of operation assuming simultaneous pickup operation is performed by using XY robot 30 to move mounting head 40 above component camera 26, using R-axis driving device 50 to revolve each nozzle holder 42, using both of first and second Z-axis driving devices 70 and 75 to lower two corresponding nozzle holders 42, and imaging a stopping position of those nozzle holders 42 using component camera 26. Measurement of these operations is performed for each nozzle holder 42.

Then, CPU 91 sets a simultaneous pickup permission flag F indicating whether simultaneous pickup operation is permitted to 0 (S120), and ends the head attachment processing routine. Here, the simultaneous pickup permission flag F is a flag indicating whether the simultaneous pickup operation is allowed to be performed. The simultaneous pickup flag F indicates that simultaneous pickup operation is prohibited when the value is 0, and indicates that simultaneous pickup operation is permitted when the value is 1. In the present embodiment, when mounting head 40 is exchanged, CPU 91 determines that the lowering position accuracy of suction nozzle 44 may not be adequate, and sets the simultaneous pickup flag F to 0 to prohibit the simultaneous pickup operation.

Figure 8:
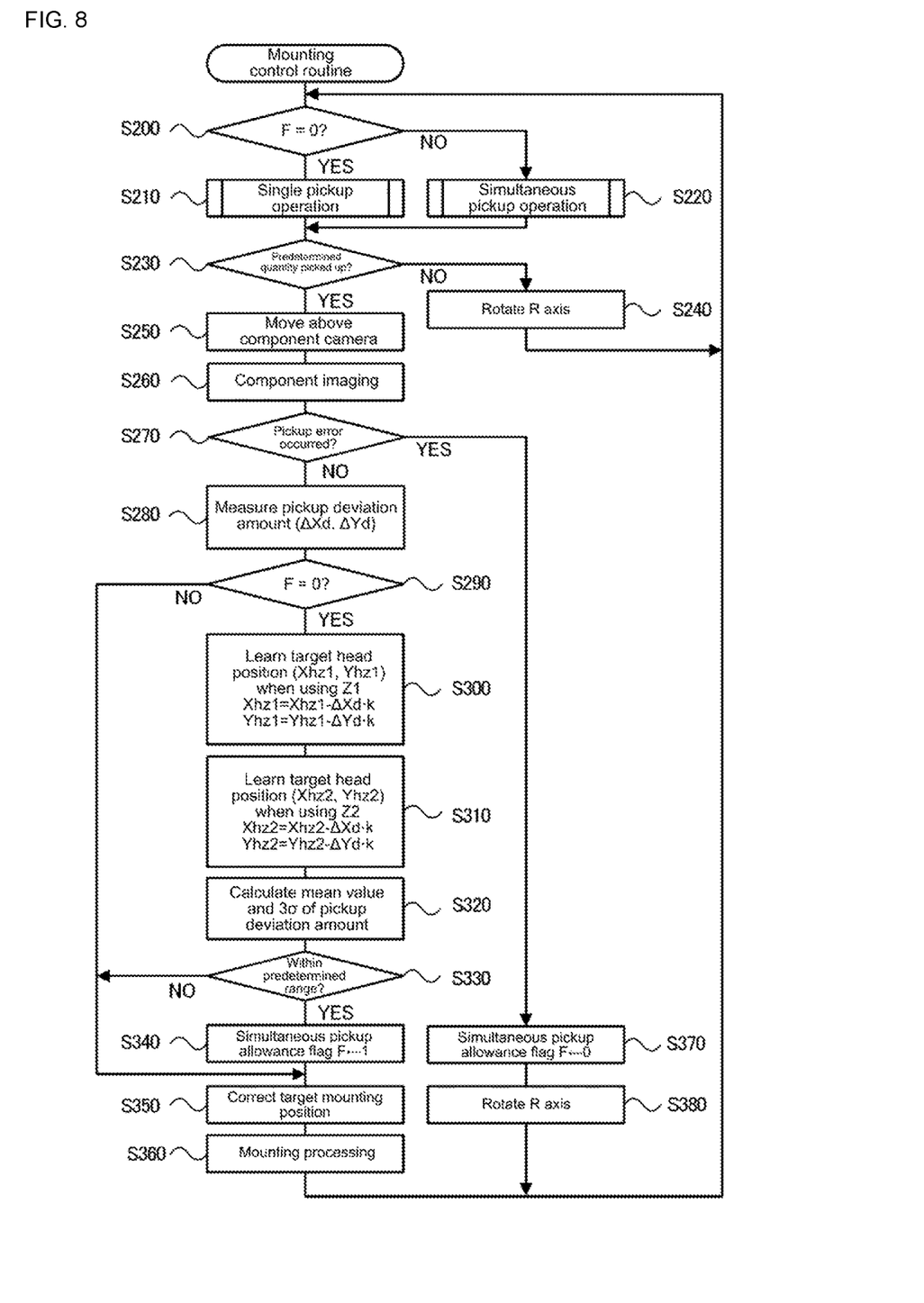
FIG. 8 is a flowchart showing an example of a mounting control routine.

Next, the operation of component mounting machine 10 when component P is picked up and mounted on board S using single pickup operation or simultaneous pickup operation will be described. FIG. 8 is a flowchart showing an example of a mounting control routine performed by CPU 91 of control device 90. This routine is performed when job information is received from management device 100. Note that, in the present embodiment, the mounting control routine is applied when repeatedly performing operation of picking up components P of the same type and mounting them on board S. When the mounting control routine is performed, CPU 91 of control device 90 first determines whether the simultaneous pickup permission flag F is 0 (S200). If determining that the simultaneous pickup permission flag F is 0, CPU 91 determines that simultaneous pickup operation is prohibited, so performs single pickup operation of picking up one component P with one pickup target nozzle (S210). The single pickup operation is performed by executing the single pickup processing routine shown in FIG. 9. The single pickup processing routine will be described later. On the other hand, if determining that the simultaneous pickup permission flag F is 1, CPU 91 determines that simultaneous pickup operation is allowed, so performs simultaneous pickup operation of picking up two components P with two pickup target nozzles (S220). The simultaneous pickup operation is performed by executing the simultaneous pickup processing routine shown in FIG. 10. The simultaneous pickup processing routine will be described later. Upon performing the single pickup operation or the simultaneous pickup operation, CPU 91 determines whether the predetermined quantity of components P has been picked up by multiple suction nozzles 44 of mounting head 40 (S230). If determining that the predetermined quantity of components P has not been picked up, CPU 91 controls the driving of R-axis driving device 50 such that the next pickup target nozzle arrives at Z1 or Z2 (a position where it can be raised and lowered by the first Z-axis driving device 70 or second Z-axis driving device 75) (S240), then returns to S200 to repeat processing of S200 to S240.

If determining that the predetermined quantity of components P has been picked up, CPU 91 controls XY robot 30 such that mounting head 40 is moved above component camera 26 (S260). Continuing, CPU 91 uses component camera 26 to image the components P held by the multiple suction nozzles 44 (S270). Next, CPU 91 recognizes components P from the acquired image and determines whether a pickup error has occurred in which a component P that should have been picked up has not been picked up by one of the multiple suction nozzles 44. Upon determining that a pickup error has occurred for any of the multiple suction nozzles 44, CPU 91 sets the simultaneous pickup permission flag F to 0 (S370). Then, the CPU91 controls R-axis driving device 50 such that the nozzle holder 42 of the suction nozzle 44 for which the pickup error occurred arrives at Z1 or Z2 (S380), returns to S200, and causes the suction nozzle 44 for which the pickup error occurred to pick up component P again. On the other hand, if determining that no pickup errors have occurred for any of the suction nozzles 44, CPU 91 recognizes the components P and the head marks M from the captured image and measures the pickup deviation amounts ($\Delta Xd$, $\Delta Yd$) of the components P held by the respective suction nozzles 44 (S280). The pickup deviation amounts ($\Delta Xd$, $\Delta Yd$) are the deviation amounts in the XY-axis directions between the center of suction nozzle 44 and the center of the component P, and are measured for each suction nozzle 44.

Next, CPU 91 determines whether the simultaneous pickup permission flag F is set to 0 (S290). If CPU 91 determines that simultaneous pickup permission flag F is set to 1, not 0, processing proceeds to S350. On the other hand, upon determining that simultaneous pickup permission flag F is set to 0, CPU 91 learns the head position correction value ($\Delta Xhz1$, $\Delta Yhz1$) of mounting head 40 when subsequently lowering suction nozzle 44 at Z1 and picking up a component P, based on the pickup deviation amounts ($\Delta Xd$, $\Delta Yd$) of the component P held by the suction nozzle 44 lowered at Z1 (S300). Learning of the head position correction values ($\Delta Xhz1$, $\Delta Yhz1$) is performed by subtracting the pickup deviation amounts ($\Delta Xd$, $\Delta Yd$) multiplied by coefficient k from the present head position correction values ($\Delta Xhz1$, $\Delta Yhz1$). Coefficient k is a reflection rate when reflecting the pickup deviation amount on the head position correction value, and is set to a value larger than 0 and smaller than 1. Coefficient k may be a fixed value, or may be reduced in accordance with the progress of learning, for example, initially set to a large value (for example, 0.5) and then set to a small value (for example, 0.3 or 0.2). Further, CPU 91 learns the head position correction value ($\Delta Xhz2$, $\Delta Yhz2$) of mounting head 40 when subsequently lowering suction nozzle 44 at Z2 and picking up a component P, based on the pickup deviation amounts ($\Delta Xd$, $\Delta Yd$) of the component P held by the suction nozzle 44 lowered at Z2 (S310). Learning of the head position correction values ($\Delta Xhz2$, $\Delta Yhz2$) is performed by subtracting the pickup deviation amounts ($\Delta Xd$, $\Delta Yd$) multiplied by coefficient k from the present head position correction values ($\Delta Xhz2$, $\Delta Yhz2$). Then, CPU 91 calculates the mean value and $3\sigma$ of the pickup deviation amounts ($\Delta Xd$, $\Delta Yd$) in the XY-axis directions (S320), and determines whether the calculated values are within a predetermined range (S330). The predetermined range is a range for determining whether the accuracy of the pickup position of component P by suction nozzle 44 is stable by learning the head movement correction value, and the predetermined range may be set as appropriate. Note that, in the present embodiment, CPU 91 evaluates the pickup position accuracy using $3\sigma$ indicating the variation of the pickup deviation amounts ($\Delta Xd$, $\Delta Yd$), but $\sigma$ or $2\sigma$ may be used. If determining that the calculated value is within the predetermined range, CPU 91 sets the simultaneous pickup permission flag F to 1 (S340) and proceeds to S350, and if determining that the calculated value is not within the predetermined range, CPU 91 skips S340 and proceeds to S350. In this manner, in the present embodiment, CPU 91 first picks up a component P using single pickup operation, then transitions to simultaneous pickup operation having learned a head movement correction amount to stabilize in steps the pickup position accuracy. This makes it possible to suppress frequent occurrence of pickup errors due to performing simultaneous pickup operation.

Further, CPU 91 corrects the target mounting position of the component P to be mounted based on the pickup deviation amounts ($\Delta Xd$, $\Delta Yd$) measured in S280 (S350), performs mounting operation for mounting the component P at the corrected target mounting position (S360), and ends the mounting control routine.

Figure 9:
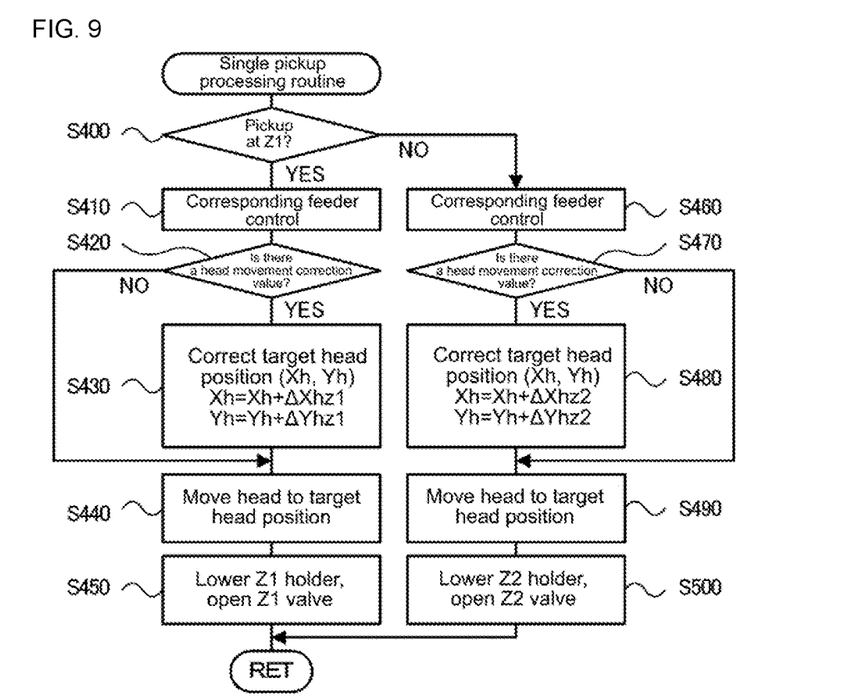
FIG. 9 is a flowchart showing an example of a single pickup processing routine.

Next, the single pickup processing routine of FIG. 9 will be described. With single pickup processing, CPU 91 first determines whether to perform the current single pickup operation at Z1 (S400). In the present embodiment, the operation order is determined such that single pickup operation at Z1 and single pickup operation at Z2 are performed alternately. If determining that the current single pickup operation is to be performed at Z1, CPU 91 outputs a control signal to tape feeder 23 such that the pickup target component that should be picked up by the suction nozzle 44 lowered at Z1 is indexed by target indexing amount Fz1 so as to be supplied to the component supply position (S410). Continuing, CPU 91 determines whether there is a head movement correction amount ($\Delta$Xhz1, $\Delta$Yhz1) set in S300 of the above mounting control routine (S420). When single pickup operation is first performed after mounting head 40 has been exchanged, a head movement correction value ($\Delta$Xhz1, $\Delta$Yhz1) has not yet been set. If determining that a head movement correction value ($\Delta$Xhz1, $\Delta$Yhz1) has not yet been set, CPU 91 proceeds to S440. On the other hand, if determining that there is a head movement correction value ($\Delta$Xhz1, $\Delta$Yhz1), CPU 91 corrects the target head position (Xh, Yh) by adding the head movement correction value ($\Delta$Xhz1, $\Delta$Yhz1) to the current target head position (Xh, Yh) (S430), then proceeds to S440. Note that, correction of the target head position may be performed by adding a portion of the head movement correction value (a value obtained by multiplying the head movement correction value by a coefficient greater than 0 and less than 1) to the current target head position. Next, CPU 91 controls XY robot 30 such that mounting head 40 arrives at the target head position (Xh, Yh) (S440). Further, CPU 91 controls first Z-axis driving device 70 to lower the pickup target nozzle (Z1 holder lowering), and first valve driving device 45 such that negative pressure is supplied to the suction opening of the pickup target nozzle (Z1 valve opening) (S450), then ends the single pickup processing routine.

In S400, if determining that the current single pickup operation is to be performed at Z2, not Z1, CPU 91 outputs a control signal to tape feeder 23 such that the pickup target component that should be picked up by the suction nozzle 44 lowered at Z2 is indexed by target indexing amount Fz2 so as to be supplied to the component supply position (S460). Continuing, CPU 91 determines whether there is a head movement correction amount ($\Delta$Xhz2, $\Delta$Yhz2) set in S310 of the above mounting control routine (S470). When single pickup operation is first performed after mounting head 40 has been exchanged, a head movement correction value ($\Delta$Xhz2, $\Delta$Yhz2) has not yet been set. If determining that a head movement correction value ($\Delta$Xhz2, $\Delta$Yhz2) has not yet been set, CPU 91 proceeds to S490. On the other hand, if determining that there is a head movement correction value ($\Delta$Xhz2, $\Delta$Yhz2), CPU 91 corrects the target head position (Xh, Yh) by adding the head movement correction value ($\Delta$Xhz2, $\Delta$Yhz2) to the current target head position (Xh, Yh) (S430), then proceeds to S440. Note that, correction of the target head position may be performed by adding a portion of the head movement correction value (a value obtained by multiplying the head movement correction value by a coefficient greater than 0 and less than 1) to the current target head position. Next, CPU 91 controls XY robot 30 such that mounting head 40 arrives at the target head position (Xh, Yh) (S490). Further, CPU 91 controls second Z-axis driving device 75 to lower the pickup target nozzle (Z2 holder lowering), and second valve driving device 46 such that negative pressure is supplied to the suction opening of the pickup target nozzle (Z2 valve opening) (S500), then ends the single pickup processing routine.

Figure 10:
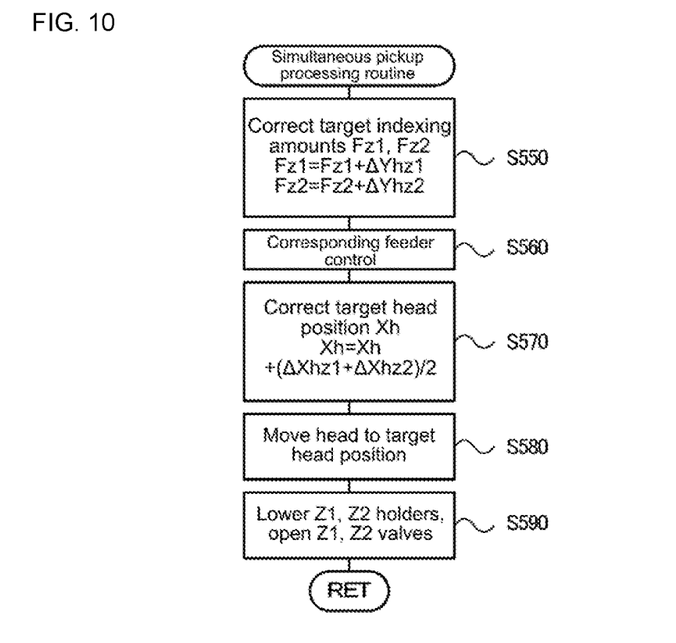
FIG. 10 is a flowchart showing an example of a simultaneous pickup processing routine.

Next, the simultaneous pickup processing routine will be described. In the simultaneous pickup processing routine, CPU 91 first corrects the target indexing amounts Fz1 and Fz2 of the two pickup target components to be picked up by the two pickup target nozzles simultaneously lowered at Z1 and Z2 (S550). Correction of target indexing amount Fz1 is performed by adding head movement correction value $\Delta$Yhz1 in the Y-axis direction set in S300 of the mounting control routine to the current target indexing amount Fz1. Also, correction of target indexing amount Fz2 is performed by adding head movement correction value $\Delta$Yhz2 in the Y-axis direction set in S310 of the mounting control routine to the current target indexing amount Fz2. Note that, correction of the target indexing amount may be performed by adding a portion of the head movement correction value in the Y-axis direction (a value obtained by multiplying the head movement correction value by a coefficient greater than 0 and less than 1) to the current target indexing amount. Continuing, CPU 91 outputs a control signal to a corresponding tape feeder 23 such that each pickup target component is supplied using corrected target indexing amounts Fz1 and Fz2 (S560). Next, CPU 91 corrects target head position Xh in the X-axis direction (S570). Correction of target head position Xh in the X-axis direction is performed by adding the sum of head movement correction value $\Delta$Xhz1 in the X-axis direction set in S300 of the mounting control routine and head movement correction value $\Delta$Xhz2 in the X-axis direction set in S310 of the mounting control routine divided by two to the current target head position Xh in the X-axis direction. Note that, correction of the target head position in the X-axis direction may be performed by adding a portion of the calculated value obtained by dividing the sum of the head move correction values $\Delta$Xhz1 and $\Delta$Zhz2 in the X-axis direction (a value obtained by multiplying the calculated value by a coefficient greater than 0 and less than 1) to the current target head position in the X-axis direction. Note that, the target had position Yh in the Y-axis direction is not corrected. Continuing, CPU 91 controls XY robot 30 such that mounting head 40 arrives at the target head position (Xh, Yh) (S580). Further, CPU 91 controls first Z-axis driving device 70 and second Z-axis driving device 75 to simultaneously lower the pickup target nozzle at Z1 and the pickup target nozzle at Z2, and first valve driving device 45 and second valve driving device 46 such that negative pressure is supplied to the suction openings of the two pickup target nozzles (S590), then ends the simultaneous pickup processing routine.

Here, when simultaneously lowering the two pickup target nozzles at Z1 and Z2 to simultaneously pick up two pickup target components, since the pitch between the two pickup target nozzles (pitch in the X-axis direction) is fixed, due to the influence of tolerances of various sections and the like, the two pickup target nozzles cannot perform pickup simultaneously by aiming for the centers of the two pickup target components. For this reason, with component mounting machine 10, for example, as the size of component P to be picked up becomes smaller, such as a chip component of 0.4×0.2 mm, it becomes difficult to perform the simultaneous pickup operation. With respect to this, with component mounting machine 10 of the embodiment, first, head movement correction values ($\Delta$hz1, $\Delta$Yhz1) and ($\Delta$Xhz2, $\Delta$Yhz2) of mounting head 40 are learned while performing single pickup operation, and when the pickup position accuracy of the pickup target nozzle is stable, processing transitions to simultaneous pickup operation. By performing simultaneous pickup operation using the learned head movement correction values, component mounting machine 10 of the embodiment can sufficiently secure pickup position accuracy even for simultaneous pickup operation, and can suppress the occurrence of pickup errors even when picking up small-sized components P. Further, component mounting machine 10 of the embodiment, during simultaneous pickup operation, corrects the target head position Xh in the X-axis direction of mounting head 40 using the head movement correction values ΔXhz1 and ΔXhz2 in the X-axis direction, and corrects the target indexing amounts Fz1 and Fz2 of two tape feeders 23 for supplying two pickup target components using the head movement correction values ΔYhz1 and ΔYhz2 in the Y-axis direction. Thus, in the simultaneous pickup operation, component mounting machine 10 can individually correct the pickup deviation in the Y-axis direction at Z1 and Z2, such that the accuracy of the pickup position in the Y-axis direction can be improved. Note that, since simultaneous pickup operation becomes more difficult as the size of component P gets smaller, component mounting machine 10 may, of course, perform simultaneous pickup operation from the beginning when the size of component P to be picked up is equal to or larger than a predetermined size.

Here, correspondence relationships between constituent elements of an embodiment and constituent elements of the present disclosure described in the claims will be clarified. Component supply section 22 of an embodiment corresponds to a component supply section of the present disclosure, tape feeder 23 corresponds to a component feeder, component mounting machine 10 corresponds to a component mounting machine, suction nozzle 44 corresponds to a nozzle, mounting head 40 corresponds to a head, first and first Z-axis driving devices 70 and 75 correspond to a raising and lowering device, XY robot 30 corresponds to a moving device, and control device 90 corresponds to a control device. Further, mounting head 40 corresponds to a rotary head, first Z-axis driving device 70 corresponds to a first raising and lowering device, and second Z-axis driving device 75 corresponds to a second raising and lowering device.

Component mounting machine 10 of an embodiment described above includes control device 90 configured to perform, as a pickup operation, a first pickup operation (single pickup operation) lowering one nozzle and supplying negative pressure to the suction opening of that nozzle so as to pick up the component, and a second pickup operation (simultaneous pickup operation) of lowering multiple nozzles simultaneously and supplying negative pressure to the suction openings of those multiple nozzles so as to pick up the components simultaneously. Control device 90 is configured to, in a case in which pickup operation and mounting operation is to be performed repeatedly for a same type of the component, initially perform the first pickup operation for each of the multiple suction nozzles 44, and during the first pickup operation, learn a correction value for correcting a deviation of a pickup position of each of the components picked up by the multiple suction nozzles 44, and subsequent to a specified condition being satisfied, perform the second pickup operation using the learned correction value. In this manner, with component mounting machine 10 of the present disclosure, when pickup operation and mounting operation are performed repeatedly for the same type of component, the first pickup operation is performed for each of the multiple suction nozzles 44 to learn the correction value for correcting the deviation of the pickup position, and then operation transitions to the second pickup operation. As a result, component mounting machine of the present disclosure can perform simultaneous pickup operation of simultaneously picking up multiple components using multiple suction nozzles 44 with high accuracy.

Further, component mounting machine 10 of an embodiment measures the variation (mean value and 3σ of the pickup deviation amount) of the pickup position of component P picked up by suction nozzle 44 with the first pickup operation (single pickup operation), and performs the second pickup operation (simultaneous pickup operation) after the variation has converged within a predetermined range. Accordingly, component mounting machine 10, by performing the second pickup operation based on a correction value learned during the first pickup operation, it is possible to improve the accuracy of the second pickup operation, and, for example, realize the simultaneous pickup of extremely small components such as 0.4×0.2 mm chip components.

Further, component mounting machine 10 of the embodiment, during the second pickup operation (simultaneous pickup operation), corrects the target head position Xh in the X-axis direction of mounting head 40 using the head movement correction values ΔXhz1 and ΔXhz2 in the X-axis direction, and corrects the target indexing amounts Fz1 and Fz2 of two applicable tape feeders 23 using the head movement correction values ΔYhz1 and ΔYhz2 in the Y-axis direction. Thus, in the second pickup operation, component mounting machine 10 can individually correct the pickup deviation in the Y-axis direction at Z1 and Z2, such that the accuracy of the pickup position in the Y-axis direction can be improved.

Further, with component mounting machine 10 of the embodiment, when mounting head 40 is exchanged or a pickup error occurs during simultaneous pickup operation, the simultaneous pickup permission flag F is set to 0 to prohibit the simultaneous pickup operation. Thus, it is possible to avoid the simultaneous pickup operation from being performed under a condition in which the pickup position accuracy has deteriorated, making it possible to suppress the frequent occurrence of pickup errors.

Meanwhile, it goes without saying that the disclosure is not limited to the above-mentioned embodiment and various embodiments may be applied within the technical scope of the disclosure.

For example, in an embodiment described above, the component mounting machine 10 includes rotary-type mounting head 40 in which multiple nozzle holders 42 are circumferentially arranged with respect to head main body 41. However, component mounting machine 10 may include an inline-type mounting head having nozzle holders (suction nozzles) arranged at the same pitch as the component feeders (tape feeders 23) along the arrangement direction of the component feeders and capable of being raised and lowered independently.

In an embodiment described above, mounting head 40 includes two Z-axis driving devices, 70 and 75, for individually raising and lowering two nozzle holders 42 (suction nozzles 44) at a specified position. However, mounting head 40 may include three or more Z-axis driving devices, and may simultaneously lower three or more suction nozzles using the three or more Z-axis driving devices so as to simultaneously pick up three or more components P using the respective suction nozzles.

In an embodiment described above, CPU 91, during simultaneous pickup operation, corrects the target indexing amounts Fz1 and Fz2 of the two tape feeders 23 that supply the two pickup target components using head movement correction values ΔYhz1 and ΔYhz2 in the Y-axis direction. Further, CPU 91 corrects target head position Xh of mounting head 40 in the X-axis direction using head movement correction values ΔXhz1 and ΔXhz2 in the X-axis direction, and does not correct the target head position Yh of mounting head 40 in the Y-axis direction. However, instead of correcting the target indexing amounts Fz1 and Fz2, CPU91 may correct the target head position Yh of the mounting head 40 in the Y-axis direction using the head movement correction values ΔYhz1 and ΔYhz2 in the Y-axis direction. In this case, CPU 91 may correct the target head position Yh by adding the sum of the head movement correction value ΔYhz1 and the head movement correction value ΔYhz2 divided by two to the current Y-axis target head position Yh.

In an embodiment described above, CPU 91 transitions to the simultaneous pickup operation after the pickup position accuracy of suction nozzle 44 (mean value and 3σ of the pickup deviation amount) has converged within a predetermined range in the single pickup operation. However, CPU 91 may transition to the simultaneous pickup operation when the progress of learning of the head movement correction value reaches a predetermined level in the single pickup operation, for example, when the number of learning times has reached a predetermined number of times.

In an embodiment described above, CPU 91 sets the simultaneous pickup permission flag F to 0 to prohibit simultaneous pickup operation when mounting head 40 has been exchanged or when a pickup error has occurred in the simultaneous pickup operation. However, the configuration is not limited to this, and CPU 91 may set the simultaneous pickup permission flag F to 0 when tape feeder 23 is exchanged.

In an embodiment above, XY robot 30 moves mounting head 40 in XY-axis directions, however, board B may be moved in XY-axis directions.

In an embodiment described above, component mounting machine 10 includes position sensors 37, 39, 55, 65, 73, and 78 for detecting the positions of the respective axes (X axis, Y axis, R axis, Q axis, and Z axis), but the "position sensors" may include an encoder or a linear scale.

INDUSTRIAL APPLICABILITY

The present disclosure may be applied to the industrial field of component mounters and the like.

REFERENCE SIGNS LIST

1: component mounting system;
10: component mounting machine;
12: housing;
22: component supply section;
23: tape feeder;
24: board conveyance device;
26: component camera;
28: mark camera;
29: nozzle station;
30: XY robot;
31: X-axis guide rail;
32: X-axis slider;
33: Y-axis guide rail;
34: Y-axis slider;
36: X-axis motor;
37: X-axis position sensor;
38: Y-axis motor;
39: Y-axis position sensor;
40: mounting head;
41: head main body;
41a: radial flow path;
42: nozzle holder;
42a: holder flow path;
44: suction nozzle;
45: first valve driving device;
46: second valve driving device;
47, 48: side surface camera;
50: R-axis driving device;
31: R-axis motor;
52: R axis;
53: transmission gear;
55: R-axis position sensor;
60: Q-axis driving device;
61: Q-axis motor;
62: cylindrical gear;
62a: external tooth;
64: Q-axis gear;
65: Q-axis position sensor;
70: first Z-axis driving device;
71, 76: Z-axis motor;
72, 77: Z-axis slider;
73, 78: Z-axis position sensor;
75: second Z-axis driving device;
80: pressure supply device;
81: negative pressure source;
82: positive pressure source;
83: negative pressure flow path;
84: positive pressure flow path;
85: atmospheric pressure flow path;
86: switching valve;
87: valve operating lever;
88: pressure sensor;
90: control device;
91: CPU;
92: ROM; 93: HDD;
94: RAM;
95: input-output interface;
96: bus;
100: management device;
101: CPU;
102: ROM;
103: HDD;
104: RAM;
105: input-output interface;
107: input device;
108: display;
P: component;
S: board

The invention claimed is:

1. A component mounting machine comprising:
a component supply section, the component mounting machine being configured to pick up components supplied from multiple component feeders arranged on the component supply section and mount the components on a board;
a head provided with multiple nozzles configured to pick up the components;
a raising and lowering device configured to individually raise and lower the multiple nozzles;
a moving device configured to move the head relative to the board in a plane perpendicular to a raising and lowering direction of the nozzles; and
a control device configured to perform, as a pickup operation for causing the nozzle to pick up a component, a first pickup operation of controlling the moving device and the raising and lowering device so as to lower a single one of the nozzles above the component supply section to pick up one of the components using that nozzle, and a second pickup operation of controlling the moving device and the raising and lowering device so as to simultaneously lower multiple of the nozzles above the component supply section to pick up multiple of the components simultaneously using the multiple nozzles, wherein, in a case in which pickup operation and mounting operation is to be performed repeatedly for a same type of the component, initially the first pickup operation is performed for each of the multiple nozzles, and during the first pickup operation the control device is configured to learn a deviation correction value for correcting a deviation of a pickup position of each of the components with respect to the multiple nozzles, and subsequent to a specified condition being satisfied, perform the second pickup operation using the learned correction value.

2. The component mounting machine according to claim 1, wherein
the control device is configured to measure an accuracy of the pickup position of the component picked up by the nozzle during the first pickup operation, and perform the second pickup operation subsequent to the accuracy of the pickup position becoming within a specified range as the specified condition.

3. The component mounting machine according to claim 1, wherein
the control device is configured to perform the second pickup operation subsequent to a learning of the deviation correction value a plurality of times and reaching a specified level as the specified condition.

4. The component mounting machine according to claim 1, wherein
the control device is configured to, during the second pickup operation, correct a moving position of the head based on the learned correction value.

5. The component mounting machine according to claim 1, wherein
the component feeder is a tape feeder configured to supply tape housing multiple components of the same type in a specified direction,
multiple of the tape feeders are lined up on the component supply section in a direction perpendicular to the specified direction so as to supply multiple of the components to be picked up simultaneously by the multiple nozzles, and the control device is configured to, during the second pickup operation, correct a supply amount of tape of each of the multiple tape feeders and correct the moving position of the head in the direction perpendicular to the supply direction of the tape, based on the learned correction value.

6. The component mounter according to claim 1, wherein
the control device is configured to end performing of the second pickup operation based on exchange of the component feeder, exchange of the head, or an occurrence of a pickup error.

7. The component mounting machine according to claim 1, wherein
the head is a rotary head that includes a rotation body configured to support multiple nozzle holders so as to be raised and lowered, the multiple nozzle holders being configured to hold the nozzles and being arranged in a circumferential direction, the rotary head being configured to revolve the multiple nozzle holders in the circumferential direction by rotating the rotation body, and
the raising and lowering device includes a first raising and lowering device configured to raise and lower, among the multiple nozzle holders, the nozzle holder positioned at a first position, and a second raising and lowering device configured to raise and lower, among the multiple nozzle holders, the nozzle holder positioned at a second position that is different from the first position.

8. The component mounting machine according to claim 1, wherein the raising and lowering device includes a first raising and lowering device configured to raise and lower, among the multiple nozzle holders, the nozzle holder positioned at a first position at 0 degrees, and a second raising and lowering device configured to raise and lower, among the multiple nozzle holders, the nozzle holder positioned at a second position at 180 degrees, and
wherein, with respect to a board conveyance direction, the first position at 0 degrees is a position at a farthest upstream side in the board conveyance direction among two points on a line parallel to the board conveyance direction passing through a center axis of head, and the second position at 180 degrees is a position at a farthest downstream side in the board conveyance direction of the two points.

* * * * *